(12) United States Patent
Yu et al.

(10) Patent No.: US 12,238,865 B2
(45) Date of Patent: Feb. 25, 2025

(54) INTEGRATED CIRCUIT STRUCTURE

(71) Applicant: Taiwan Semiconductor Manufacturing Co., Ltd., Hsinchu (TW)

(72) Inventors: Chen-Hua Yu, Hsinchu (TW); Jui-Pin Hung, Hsinchu (TW); Kuo-Chung Yee, Taoyuan (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 328 days.

(21) Appl. No.: 17/706,037

(22) Filed: Mar. 28, 2022

(65) Prior Publication Data
US 2022/0217847 A1    Jul. 7, 2022

Related U.S. Application Data

(60) Continuation of application No. 16/524,993, filed on Jul. 29, 2019, now Pat. No. 11,291,116, which is a (Continued)

(51) Int. Cl.
*H05K 1/18* (2006.01)
*H01L 21/56* (2006.01)
(Continued)

(52) U.S. Cl.
CPC .......... *H05K 1/181* (2013.01); *H01L 21/6835* (2013.01); *H01L 24/19* (2013.01);
(Continued)

(58) Field of Classification Search
CPC ........ H05K 1/181; H05K 3/301; H05K 3/341; H05K 2201/10098; H05K 2201/10189; H05K 2201/10378; H01L 21/6835; H01L 24/19; H01L 24/20; H01L 24/97; H01L 25/105; H01L 25/50; H01L 21/561; H01L 21/568; H01L 23/3128; H01L 24/32; H01L 24/48; H01L 24/73; H01L 25/0657; H01L 2221/68318; H01L 2221/68359; H01L 2221/68372; H01L 2221/68381;
(Continued)

(56) References Cited

U.S. PATENT DOCUMENTS 5,905,633 A * 5/1999 Shim ........................ H05K 7/20
257/713
8,049,325 B2   11/2011  Mu-Seob et al.
(Continued)

FOREIGN PATENT DOCUMENTS

JP    2010130004 A    6/2010
KR    20130054115 A   5/2013
KR    20140050507 A   4/2014

*Primary Examiner* — Jonathan Han
(74) *Attorney, Agent, or Firm* — Slater Matsil, LLP

(57) ABSTRACT

An integrated circuit structure and method of forming is provided. A die is placed on a substrate and encased in molding compound. A redistribution layer is formed overlying the die and the substrate is removed. One or more surface mounted devices and/or packages are connected to the redistribution layer on an opposite side of the redistribution layer from the die. The redistribution layer is connected to a printed circuit board.

20 Claims, 9 Drawing Sheets

Related U.S. Application Data division of application No. 14/928,768, filed on Oct. 30, 2015, now Pat. No. 10,368,442.

(60) Provisional application No. 62/140,356, filed on Mar. 30, 2015.

(51) Int. Cl.

| | | |
|---|---|---|
| *H01L 21/683* | (2006.01) | |
| *H01L 23/00* | (2006.01) | |
| *H01L 23/31* | (2006.01) | |
| *H01L 25/00* | (2006.01) | |
| *H01L 25/065* | (2023.01) | |
| *H01L 25/10* | (2006.01) | |
| *H05K 3/30* | (2006.01) | |
| *H05K 3/34* | (2006.01) | |

(52) U.S. Cl.
CPC .............. *H01L 24/20* (2013.01); *H01L 24/97* (2013.01); *H01L 25/105* (2013.01); *H01L 25/50* (2013.01); *H01L 21/561* (2013.01); *H01L 21/568* (2013.01); *H01L 23/3128* (2013.01); *H01L 24/32* (2013.01); *H01L 24/48* (2013.01); *H01L 24/73* (2013.01); *H01L 25/0657* (2013.01); *H01L 2221/68318* (2013.01); *H01L 2221/68359* (2013.01); *H01L 2221/68372* (2013.01); *H01L 2221/68381* (2013.01); *H01L 2223/6677* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2225/0651* (2013.01); *H01L 2225/06568* (2013.01); *H01L 2225/1035* (2013.01); *H01L 2225/1058* (2013.01); *H01L 2924/00014* (2013.01); *H01L 2924/14* (2013.01); *H01L 2924/1421* (2013.01); *H01L 2924/1431* (2013.01); *H01L 2924/1434* (2013.01); *H01L 2924/1436* (2013.01); *H01L 2924/1437* (2013.01); *H01L 2924/1461* (2013.01); *H01L 2924/15311* (2013.01); *H01L 2924/18162* (2013.01); *H01L 2924/19011* (2013.01); *H01L 2924/19041* (2013.01); *H01L 2924/19043* (2013.01); *H01L 2924/19105* (2013.01); *H01L 2924/3511* (2013.01); *H05K 3/301* (2013.01); *H05K 3/341* (2013.01); *H05K 2201/10098* (2013.01); *H05K 2201/10189* (2013.01); *H05K 2201/10378* (2013.01); *Y02P 70/50* (2015.11); *Y10T 29/4913* (2015.01)

(58) Field of Classification Search
CPC ... H01L 2223/6677; H01L 2224/04105; H01L 2224/12105; H01L 2224/32145; H01L 2224/32225; H01L 2224/48091; H01L 2224/48227; H01L 2224/73265; H01L 2225/0651; H01L 2225/06568; H01L 2225/1035; H01L 2225/1058; H01L 2924/00014; H01L 2924/14; H01L 2924/1421; H01L 2924/1431; H01L 2924/1434; H01L 2924/1436; H01L 2924/1437; H01L 2924/1461; H01L 2924/15311; H01L 2924/18162; H01L 2924/19011; H01L 2924/19041; H01L 2924/19043; H01L 2924/19105; H01L 2924/3511; H01L 23/3185; H01L 23/482; H01L 24/02; H01L 24/80; H01L 2224/0233; H01L 2224/02373; H01L 2224/80; H01L 2924/00; Y02P 70/50; Y10T 29/4913

See application file for complete search history.

(56) References Cited

U.S. PATENT DOCUMENTS

| | | |
|---|---|---|
| 8,361,842 B2 | 1/2013 | Yu et al. |
| 8,627,563 B2 | 1/2014 | Wing et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2008/0109838 A1 | 5/2008 | Zureczki et al. |
| 2011/0291288 A1 | 12/2011 | Wu et al. |
| 2012/0119378 A1 | 5/2012 | Ng et al. |
| 2012/0273782 A1 | 11/2012 | Goel et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0135823 A1 | 5/2013 | Kim et al. |
| 2013/0168805 A1 | 7/2013 | Yu et al. |
| 2013/0168848 A1 | 7/2013 | Lin et al. |
| 2013/0307140 A1 | 11/2013 | Huang et al. |
| 2014/0103488 A1 | 4/2014 | Chen et al. |
| 2014/0110841 A1* | 4/2014 | Beer ............... H01Q 9/16 257/738 |
| 2014/0110856 A1 | 4/2014 | Lin |
| 2014/0203429 A1 | 7/2014 | Yu et al. |
| 2014/0225222 A1 | 8/2014 | Yu et al. |
| 2014/0239438 A1 | 8/2014 | Kilger et al. |
| 2014/0252568 A1 | 9/2014 | Hwang et al. |
| 2014/0252646 A1 | 9/2014 | Hung et al. |
| 2014/0264839 A1* | 9/2014 | Tsai ............... H01L 24/19 257/737 |
| 2014/0264930 A1 | 9/2014 | Yu et al. |
| 2014/0321093 A1 | 10/2014 | Pande et al. |
| 2015/0194362 A1 | 7/2015 | Otremba et al. |
| 2015/0229017 A1 | 8/2015 | Suzuki et al. |
| 2015/0235990 A1 | 8/2015 | Cheng et al. |
| 2015/0303174 A1 | 10/2015 | Yu et al. |
| 2016/0128197 A1 | 5/2016 | Standing et al. |
| 2016/0172274 A1 | 6/2016 | Yoon et al. |
| 2016/0190098 A1* | 6/2016 | Chen ............... H01L 21/78 257/777 |
| 2016/0322288 A1 | 11/2016 | Lin |

* cited by examiner

US 12,238,865 B2

INTEGRATED CIRCUIT STRUCTURE

This application is a continuation of U.S. patent application Ser. No. 16/524,993, filed on Jul. 29, 2019, which is a divisional of U.S. patent application Ser. No. 14/928,768, filed on Oct. 30, 2015, now U.S. Pat. No. 10,368,442 issued on Jul. 30, 2019, which claims the benefit of U.S. Provisional Application No. 62/140,356, filed on Mar. 30, 2015, which applications are hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DIC wherein dies are packaged and are then packaged together with another packaged die or dies.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
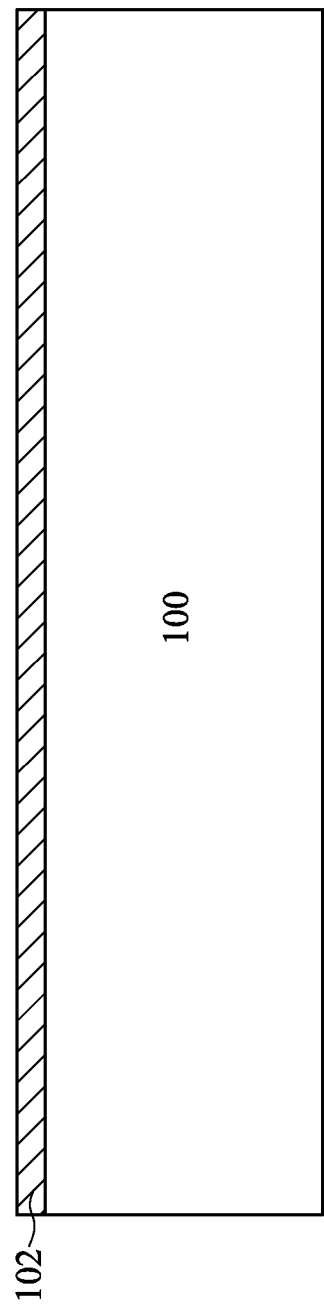
FIGS. 1-7 are cross sections of intermediate stages in the making of an integrated circuit structure according to exemplary embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a standalone three dimensional (3D) integrated fan-out (InFO) package and printed circuit board (PCB) structure installed in a cover and suitable for use, for example, with home appliances. Other embodiments may be suitable for other applications. For example, some embodiments may be suitable for medical devices, home automation, geographic location services, mobile communications, and marketing applications. Many different embodiments and applications are possible.

An integrated circuit structure and methods of forming the same are provided in accordance with various exemplary embodiments. The intermediate stages of forming the integrated circuit structure are illustrated and variations of embodiments are discussed.

FIGS. 1-7 illustrate cross-sectional views of intermediate steps in forming an integrated circuit structure in accordance with some embodiments. Referring first to FIG. 1, there is shown a carrier substrate 100 and buffer layer 102. Generally, the carrier substrate 100 provides temporary mechanical and structural support during subsequent processing steps. The carrier substrate 100 may include any suitable material, such as, for example, silicon based materials, such as a silicon wafer, glass or silicon oxide, or other materials, such as aluminum oxide, a ceramic material, combinations of any of these materials, or the like. In some embodiments, the carrier substrate 100 is planar in order to accommodate further processing.

An optional release layer (not shown) may be formed over the carrier substrate 100 that may allow easier removal of the carrier substrate 100. As explained in greater detail below, various layers and devices will be placed over the carrier substrate 100, after which the carrier substrate 100 may be removed. The optional release layer aids in the removal of the carrier substrate 100, reducing damage to the structures formed over the carrier substrate 100. The release layer may be formed of a polymer-based material. In some embodiments, the release layer is an epoxy-based thermal release material, which loses its adhesive property when heated, such as a Light-to-Heat-Conversion (LTHC) release coating. In other embodiments, the release layer may be an ultra-violet (UV) glue, which loses its adhesive property when exposed to UV light. The release layer may be dispensed as a liquid and cured. In other embodiments, the release layer may be a laminate film laminated onto the carrier substrate 100. Other release layers may be utilized.

Buffer layer 102 is formed over carrier substrate 100. Buffer layer 102 is a dielectric layer, which may be a polymer (such as polybenzoxazole (PBO), polyimide, benzocyclobutene (BCB), or the like), a nitride (such as silicon nitride or the like), an oxide (such as silicon oxide, PhosphoSilicate Glass (PSG), BoroSilicate Glass (BSG), Boron-doped PhosphoSilicate Glass (BPSG), or a combination thereof, or the like), or the like, and may be formed, for example, by spin coating, lamination, Chemical Vapor Deposition (CVD), or the like. In some embodiments, buffer layer 102 is a planar layer, within process variations, having a uniform thickness, wherein the thickness may be between about 5 μm and about 20 μm. The top and the bottom surfaces of buffer layer 102 are also planar, within process variations.

Figure 2:
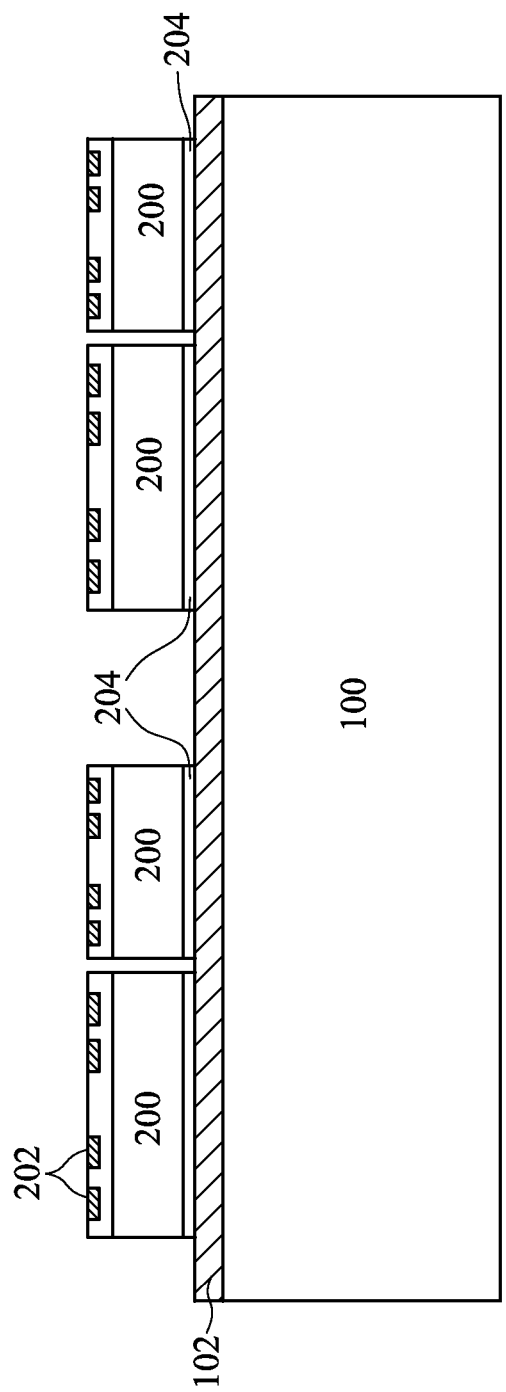

FIG. 2 illustrates attaching a plurality of integrated circuit dies 200 to the backside of buffer layer 102 in accordance with some embodiments. In some embodiments, the integrated circuit dies 200 may be adhered to buffer layer 102 by an adhesive layer 204, such as a die-attach film (DAF). In an embodiment, the die-attach film 204 may only be located directly below the integrated circuit dies 200 as shown in FIG. 2. In other embodiments, the die-attach film 204 may extend over the buffer layer 102 between adjacent integrated circuit dies 200. A thickness of the adhesive layer may be in a range from about 5 μm to about 50 μm, such as about 20 um. Any number of integrated circuit dies 200 may be used, and integrated circuit dies 200 may include any die suitable for a particular approach. For example, the integrated circuit dies 200 may include a static random access memory (SRAM) chip or a dynamic random access memory (DRAM) chip, a processor, a memory chip, logic chip, analog chip, digital chip, a central processing unit (CPU), a graphics processing unit (GPU), a baseband processor, a microcontroller unit (MCU), a radio frequency (RF) chip, a sensor chip, a micro-electro-mechanical-system (MEMS) chip, an integrated passive device (IPD), or a combination thereof, or the like. Before being attached to the buffer layer 102, the integrated circuit dies 200 may be processed according to applicable manufacturing processes to form integrated circuits above the integrated circuit die 200. Each of dies 200 may include a substrate (a silicon substrate, for example) that is coupled to an adhesive layer, wherein the back surface of semiconductor substrate is coupled to the adhesive layer.

In some exemplary embodiments, the dies 200 include contacts 202 (such as copper posts) that are electrically coupled to devices such as transistors in dies 200. In some embodiments, a dielectric layer (not shown) is formed at the top surface of the respective die 200, with contacts 202 having at least lower portions in the dielectric layer. The top surfaces of the contacts 202 may also be level with the top surfaces of the dielectric layer in some embodiments. Alternatively, contacts 202 may protrude above and/or submerge below a top layer of the respective dies 200. In other embodiments, other structures may be used for the contacts 202, such as traces, metal pillars, copper stud, gold stud or the like.

Figure 3:
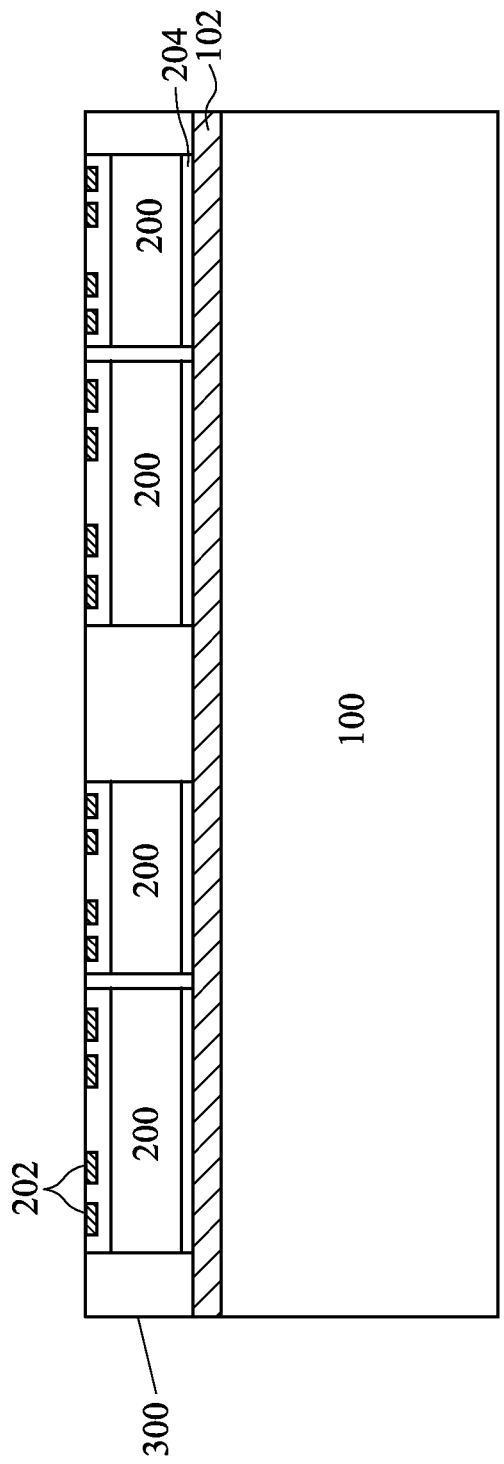

Referring to FIG. 3, molding material 300 is molded and/or laminated on dies 200. Molding material 300 fills the gaps between dies 200 and may be in contact with buffer layer 102. Furthermore, molding material 300 is filled into the gaps between contacts 202 when portions of contacts 202 are protruding. Molding material 300 may include a molding compound, a molding underfill, an epoxy, a resin, a dry film or the like. In some embodiments, the top surface of molding material 300 is higher than the top ends of contacts 202.

A grinding step may be performed to thin molding material 300 to expose contacts 202. The resulting structure is shown in FIG. 3. Due to the grinding, the top ends of contacts 202 may be substantially level (coplanar) with the top surface of molding material 300. As a result of the grinding, metal residues such as metal particles may be generated, and left on the top surfaces of the molding material 300 and contacts 202. Accordingly, after the grinding, a cleaning may be performed, for example, through a wet etching, so that the metal residue is removed.

Figure 4:
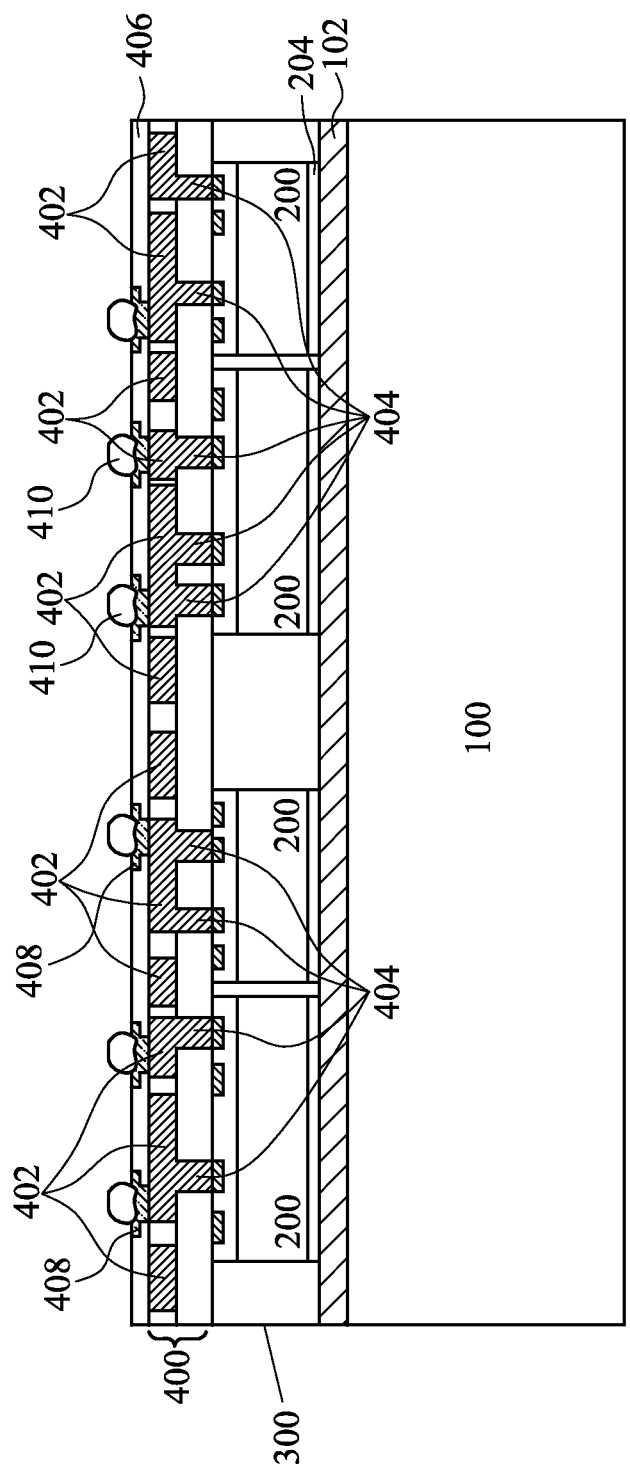

Next, referring to FIG. 4, one or more redistribution layers (RDLs) 400 are formed. Generally, RDLs provide a conductive pattern that allows a pin-out contact pattern for a completed package different than the pattern of the metal pillars, allowing for greater flexibility in the placement of dies 200. The RDLs may be utilized to provide an external electrical connection to dies 200. The RDLs comprise conductive lines 402 and vias 404, wherein vias 404 connect an overlying line to an underlying conductive feature (e.g., contacts 202 and/or conductive lines 402). The conductive lines 402 may extend along any direction, for example, to the left or right of the page or in to or out of the page.

The RDLs may be formed using any suitable process. For example, in some embodiments, a dielectric layer is formed on the molding material 300 and integrated circuit dies 200. In some embodiments, the dielectric layer is formed of a polymer, which may be a photo-sensitive material such as polybenzoxazole (PBO), polyimide, benzocyclobutene (BCB), or the like, that may be patterned using lithography. In other embodiments, the dielectric layer is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. The dielectric layer may be formed by spin coating, lamination, CVD, the like, or a combination thereof. The dielectric layer is then patterned to form openings to expose contacts 202. In embodiments in which the dielectric layer is formed of a photo-sensitive material, the patterning may be performed by exposing the dielectric layer in accordance with a desired pattern and developed to remove the unwanted material, thereby exposing contacts 202. Other methods, such as using a patterned mask and etching, may also be used to pattern the dielectric layer.

A seed layer (not shown) is formed over the dielectric layer and in the openings formed in the dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A mask is then formed and patterned on the seed layer in accordance with a desired redistribution pattern, such as the pattern illustrated in FIG. 4. In some embodiments, the mask is a photoresist formed by spin coating or the like and exposed to light for patterning. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive lines 402 and vias 404.

While the formation of one layer of RDL is described above, the process may be repeated to create more than one layer of RDLs, depending on the design of the particular approach. For example, one layer of RDLs is depicted in FIG. 4. More layers of RDLs are possible.

Next, a passivation layer 406 may be formed over an uppermost metallization pattern in accordance with some embodiments. The passivation layer may be formed of a polymer, which may be a photo-sensitive material such as PBO, polyimide, BCB, or the like, that may be patterned using a lithography mask. In other embodiments, the passivation layer is formed of a nitride or an oxide such as silicon nitride, silicon oxide, PSG, BSG, BPSG, or the like. The passivation layer may be formed by spin coating, lamination, CVD, the like, or a combination thereof. The passivation layer is then patterned to expose portions of the underlying metallization layer. The patterning may be by an acceptable process, such as by exposing the passivation layer to light when the dielectric layer is a photo-sensitive material or by etching using, for example, an anisotropic etch. Next, an under bump metallization (UBM) 408 is formed and patterned over and through the passivation layer, thereby forming an electrical connection with an uppermost metallization layer. The under bump metallization provides an electrical connection upon which an electrical connector, e.g., a solder ball/bump, a conductive pillar, or the like, may be placed. In some embodiments, the under bump metallization includes a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In some embodiments, under bump metallization is formed using sputtering. In other embodiments, electro plating may be used.

Connectors 410 may be formed over the under bump metallization in accordance with some embodiments. The connectors 410 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 410 may include a conductive material such as solder, copper, aluminum, gold, nickel, silver, palladium, tin, the like, or a combination thereof. In some embodiments, the connectors 410 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 410 may form a grid, such as a ball grid array (BGA). In some embodiments, a reflow process may be performed, giving the connectors 410 a shape of a partial sphere in some embodiments. Alternatively, the connectors 410 may comprise other shapes. The connectors 410 may also comprise non-spherical conductive connectors, for example.

In some embodiments, the connectors 410 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

Figure 5:
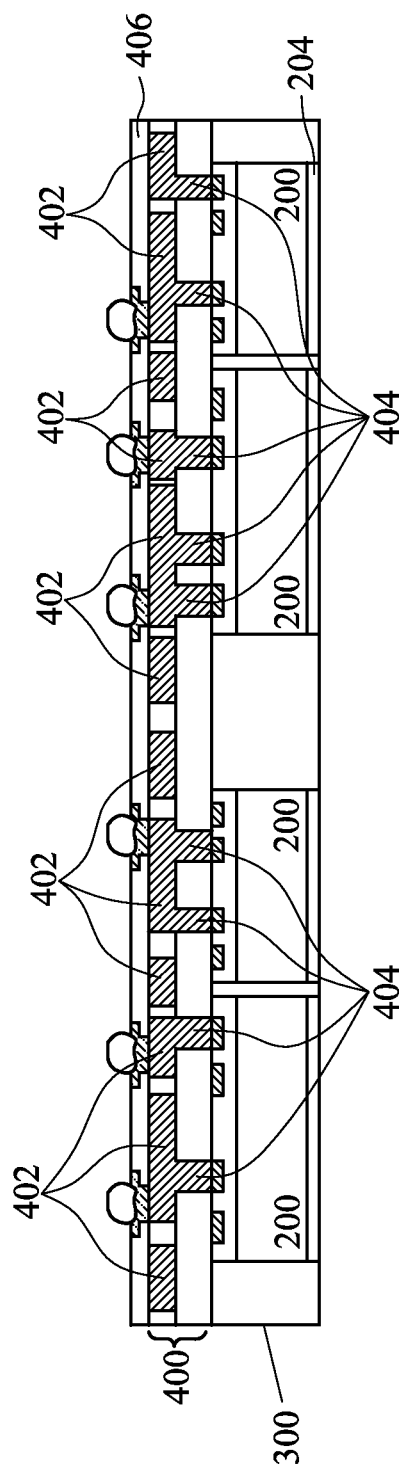

Next, carrier substrate 100 is de-bonded from buffer layer 102, as illustrated in FIG. 5. If present, the release layer is also cleaned from the buffer layer 102. For example, in the case of an epoxy-based thermal release material, which loses its adhesive property when heated, the structure is heated and the carrier substrate 100 is debonded. As another example, in the case of an ultra-violet (UV) glue release layer, the release layer is exposed to UV light and the carrier is debonded. As another example, the release layer may be dispensed as a liquid and cured. Optionally, buffer layer 102 may also be removed from the structure.

Figure 6:
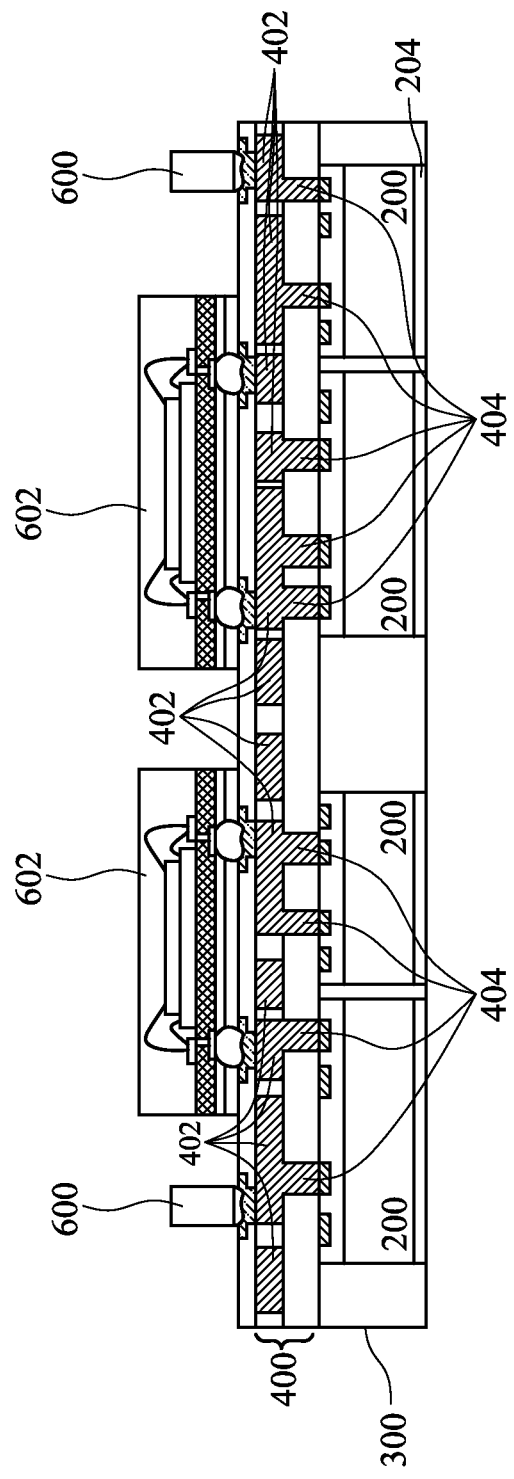

FIG. 6 illustrates the bonding of components 600 and packages 602 to the structure on the opposite side of the RDLs 400 from the dies 200. In some embodiments, depending on the total thickness of molding material 300 and RDLs 400, warpage of the structure may be an issue. If warpage is a concern, then the carrier substrate 100 may be needed to support the structure during the bonding of components 600 and packages 602 to the structure. In this case, carrier substrate is 100 debonded after the bonding of components 600 and packages 602 to the structure, instead of before.

In some embodiments, components 600 are surface mounted to the structure. Any type of surface mounted component may be used, depending on the design and requirements of particular embodiments, and may include discrete devices, passive surface mounted components (for example resistors and capacitors) as well as active devices, for example transistors, diodes, and amplifiers. Packages 602 comprising one or more dies mounted on a packaging substrate and encased in a molding material may also be connected to the structure. For example, packages 602 may include integrated circuit dies such as a static random access memory (SRAM) chip or a dynamic random access memory (DRAM) chip, a processor, a memory chip, logic chip, analog chip, digital chip, a central processing unit (CPU), a graphics processing unit (GPU), a baseband processor, a microcontroller unit (MCU), a radio frequency (RF) chip, a sensor chip, a micro-electro-mechanical-system (MEMS) chip, or a combination thereof, or the like. In some embodiments, one or more packages 602 will be tested before and after being bonded to the structure. For example, micro-electro-mechanical-systems (MEMS) packages may be tested before or after being bonded to the RDLs in some embodiments. Such packages will be bonded to the package in a manner that allows access to the package for testing purposes after being bonded. In some embodiments, integrated circuit dies packaged in a wafer level chip scale package (WLCSP) may be bonded directly to the RDLs 400 opposite the dies 200.

In some embodiments, the structure is designed in a manner that allows for electrical connections between components or packages in the structure with increased reliability. For example, depending on the design of some embodiments, a die 200 may be placed on one side of the RDLs opposite to a surface mounted component 600 or a package 602 on the other side of the RDLs in such a manner that there is a short connection path in the RDLs between the two devices. The short connection path increases the reliability of the electrical connection between the two devices as compared to a longer connection path. Additionally, some embodiments may be designed in a manner that eliminates the need for through vias, which are commonly used in many 3D wafer and/or panel level fan-out structures. For example, the embodiment depicted in FIG. 6 does not have any through vias extending through the molding material 300.

Figure 7:
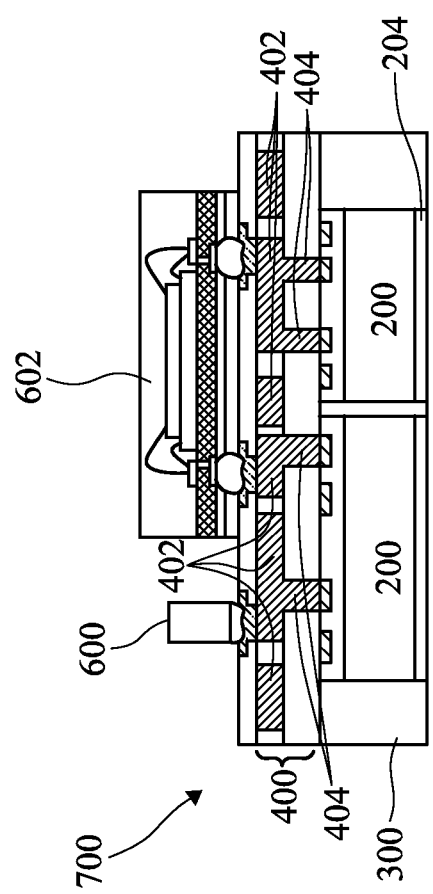

Next, the structure is singulated into a plurality of InFO structures 700. FIG. 7 illustrates a cross-sectional view of one of InFO structures 700. Each singulated InFO structure 700 may include any number of dies 200, components 600, and/or packages 602 for a particular design. For example, FIG. 7 illustrates an embodiment that includes two dies 200, one component 600, and one package 602. Other embodiments may have more or fewer of each element.

Figure 8A:
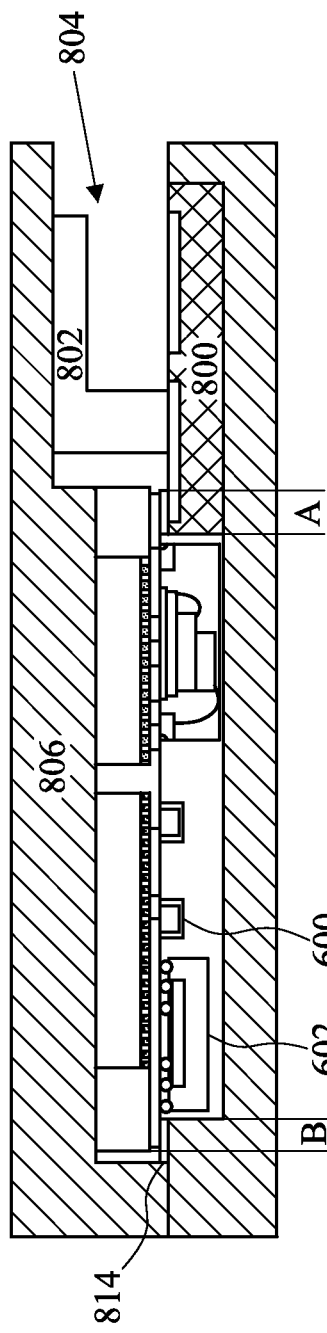
FIGS. 8A, 8B, 9A, and 9B are cross sectional and plan views of an integrated circuit structure according to exemplary embodiments.
Figure 8B:
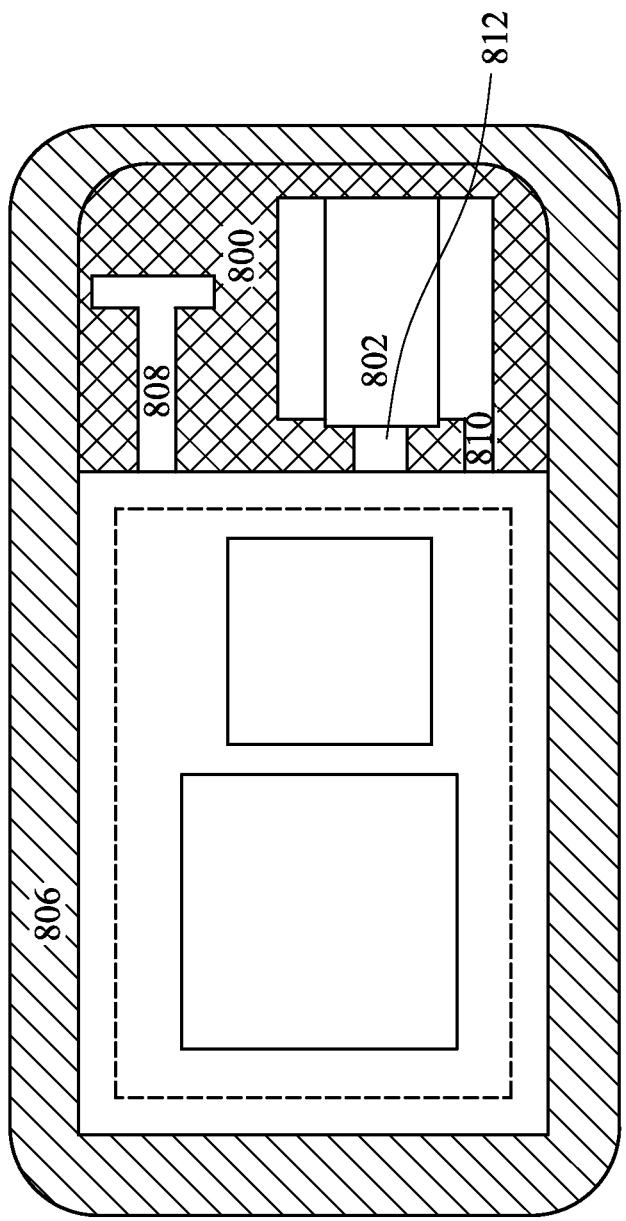

Referring now to FIGS. 8A and 8B, in some embodiments InFO structure 700 is connected to a printed circuit board (PCB) 800 and installed in a cover 806. InFO structure 700 in FIGS. 8A and 8B depict a different embodiment of InFO structure 700 than FIG. 7 for purposes of illustration. Either embodiment, or other embodiments, is possible. InFO structure 700 and PCB 800, as connected, are jointly referred to herein as integrated circuit structure 804. FIG. 8A depicts a cross sectional view of integrated circuit structure 804, while FIG. 8B depicts a plan view of integrated circuit structure 804.

PCB 800 provides increased mechanical strength to integrated circuit structure 804. PCB 800 may be mechanically stronger than InFO structure 700, and therefore may provide increased structural support to integrated circuit structure 804. The increased mechanical strength of PCB 800 may be used for mounting or connecting to larger devices, which may help to increase reliability of the integrated circuit structure 804. Also, the increased mechanical structural support of PCB 800 may enable a more secure mechanical installation of the integrated circuit structure 804 in a product than would otherwise be possible. For example, PCB 800 may allow the integrated circuit structure 804 to be installed in a product using a through hole device, for example a screw.

In some embodiments, integrated circuit structure 804 may be designed in such a manner that larger components with limited I/O requirements, such as batteries and antennas, will be mounted on, or connected to, PCB 800. InFO structure 700 has a lower mechanical strength, and can support increased I/O connections in a smaller area, as compared to PCB 800. As such, some embodiments of integrated circuit structure 804 may be designed so that larger components with minimal I/O requirements are mounted on, or mechanically connected to, PCB 800 instead of InFO structure 700. The larger components may then be electrically connected to InFO structure 700 using connective traces in PCB 800 (e.g. traces 810, 812). Such a design may preserve space on InFO structure 700 for smaller components with high I/O requirements, which is supported by RDLs 400, and enable increased miniaturization of integrated circuit structure 804, which may be desirable for some applications. For example, FIGS. 8A and 8B illustrate an embodiment having an antenna 808 and power connector 802 mounted on the PCB 800.

In some embodiments, InFO structure 700 is connected to PCB 800 at one end of the InFO structure 700 as depicted in FIGS. 8A and 8B. The connection between PCB 800 and InFO structure 700 may be on the same surface of RDLs 400 as the surface mounted components 600 and packages 602. Power connector 802 provides an electrical connection to a battery (not shown) to integrated circuit structure 804. Power connector 802 and antenna 808 are connected to InFO structure 700 by conductive traces in PCB 800. In some embodiments, as shown in FIG. 9B, trace 810 connects a terminal of a battery to InFO structure 700 and trace 812 connects the other terminal of a battery to InFO structure 700.

In some embodiments, PCB 800 is connected to InFO structure 700 using soldering. InFO structure 700 may extend a distance A of 20 μm to 2000 μm past the inner cavity edge of PCB 800. As described above, the solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. In some embodiments, a reflow process may be performed, giving the connectors a shape of a partial sphere in some embodiments. Alternatively, the connectors may comprise other shapes. The connectors may also comprise non-spherical conductive connectors, for example. In some embodiments, the InFO structure 700 may be attached to the PCB 800 using an adhesive (not shown) to provide additional support.

Integrated circuit structure 804 is installed in cover 806. In some embodiments, integrated circuit structure 804 and cover 806 form a standalone product that is configured to connect to the internet. As shown in FIG. 8A, InFO structure 700 is supported on two ends, on one end by PCB 800 and on a second end by cover 806. Integrated circuit structure 804 may be secured in cover 806 by soldering a layer of RDLs 400 to contact pad 814 using methods described earlier. In some embodiments, an adhesive may be used to connect the Info structure 700 to the cover 806. InFO structure 700 may extend a distance B of 500 μm to 2000 μm past the edge of cover 806.

Figure 9A:
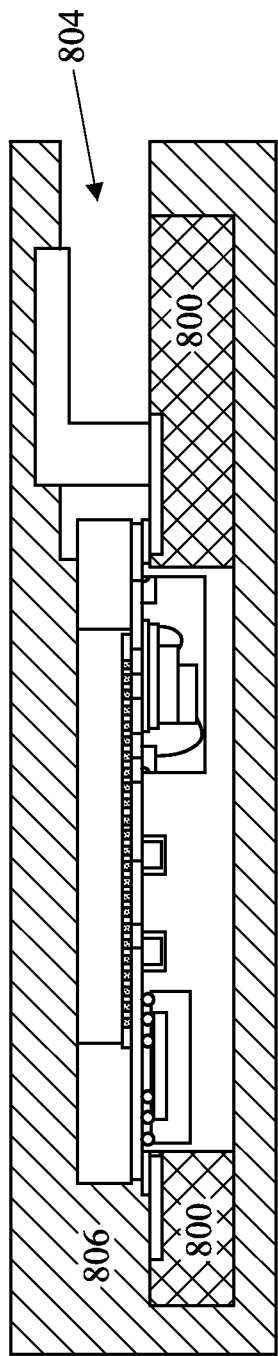
Figure 9B:
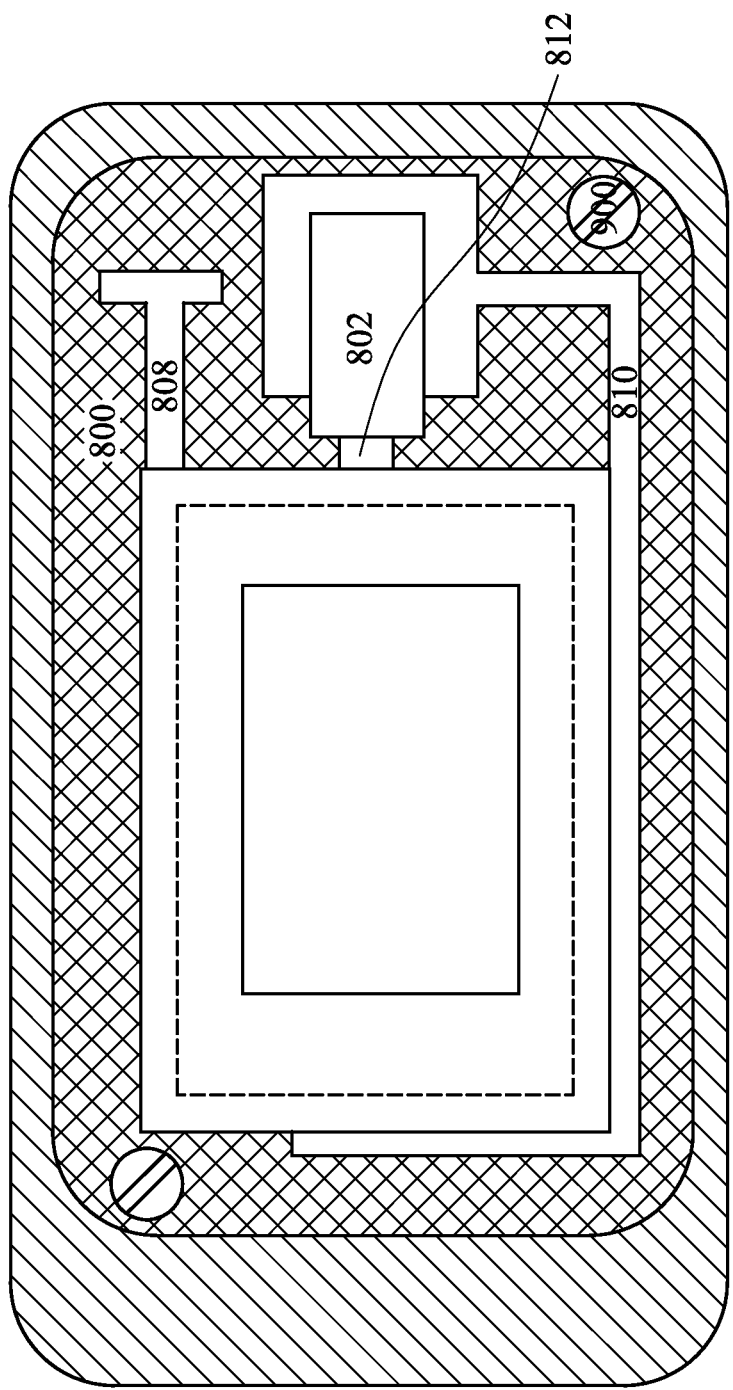

Referring to FIGS. 9A and 9B, a cross sectional view and a plan view of integrated circuit structure 804, including an InFO structure, such as InFO structure 700, connected to PCB 800, is provided. Instead of mounting InFO structure 700 to PCB 800 on one side of InFO structure 700, as depicted in FIGS. 8A and 8B, FIGS. 9A and 9B illustrates an embodiment where InFO structure 700 is mounted to PCB 800 on all four sides of InFO structure 700 by placing InFO structure 700 in an opening in PCB 800. This embodiment may provide more robust mechanical support to InFO structure 700. InFO structure 700 in FIGS. 9A and 9B depict a different embodiment of InFO structure 700 than FIGS. 7, 8A and 8B, for example in the number and placement of dies and packages, for purposes of illustration. Any of these embodiments, or other embodiments, is possible.

In some embodiments, as depicted in FIGS. 9A and 9B, InFO structure 700 is arranged in an opening in PCB 800. Power connector 802 is connected to PCB 800. Power connector 802 may be used to connect integrated circuit structure 804 to a battery (not shown). An antenna 808 is also mounted on PCB 800. Conductive lines in PCB 800 connect the power connector 802 and antenna 808 to InFO structure 700. In some embodiments, as shown in FIG. 9B, trace 810 connects one terminal of a battery to one side of InFO structure 700 and trace 812 connects the other terminal of a battery to a second side of InFO structure 700.

Mechanical installation devices 900 may be used for installing integrated circuit structure 804 in cover 806. For example, mechanical installation device may be a through hole device, such as a screw. Other suitable mechanical installation devices may be used, depending on the approach and the requirements of the product in which the integrated circuit device is being installed.

In some embodiments, integrated circuit structure 804 and cover 806 comprise a standalone structure that is installed in a product. The InFO technology of InFO structure 700 allows for miniaturization of the integrated circuit structure 804, while PCB 800 provides mechanical structural support and a secure connection for larger connectors and devices, while saving space on InFO structure 700 for components and packages with higher I/O requirements. In some embodiments, the integrated circuit structure 804 is configured to connect to the internet. Some embodiments of the integrated circuit structure 804 may be suitable for Internet of Things (IoT) devices, as some embodiments of the integrated circuit device may be miniaturized standalone devices that are configured to connect to the internet. As an example, some embodiments of integrated circuit structure 804 may be configured to be compliant with one or more standards promulgated by the ZigBee Alliance.

Although embodiments have been described herein with respect to embodiments comprising a standalone three dimensional InFO and PCB structure installed in a cover and suitable for use, for example, with home appliances, other embodiments may be suitable for other applications. For example, some embodiments may be suitable for medical devices, home automation, geographic location services, mobile communications, and marketing applications. Many different embodiments and applications are possible.

Embodiments of the invention provide a method of making a semiconductor device. The method includes placing a die over a carrier substrate and forming a molding compound adjacent to the die. A redistribution layer is formed, electrically coupled to the die and overlying the molding compound. The carrier substrate is removed. A first substrate is connected to the redistribution layer on an opposite side of the redistribution layer from the die, and the redistribution layer is connected to a printed circuit board.

Embodiments of the invention provide a method of making a semiconductor device. The method includes placing a plurality of dies over a carrier substrate. A molding compound is formed along sidewalls of the dies, wherein the molding compound absent a through via extending through the molding compound. A redistribution layer is formed, electrically coupled to the dies and overlying the molding compound. The carrier substrate is removed. One or more devices, passives components, and/or packages are placed on the redistribution layer.

Embodiments of the present invention provide a semiconductor device. The semiconductor device includes a die and molding compound extending along sidewalls of the die. A redistribution layer overlies the molding compound and the die. A substrate is mounted to the redistribution layer on an opposite side of the redistribution layer from the molding compound. A printed circuit board is connected to the redistribution layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor device, the method comprising:
   forming an integrated fan-out structure, the forming the integrated fan-out structure comprising:
      forming a redistribution structure over an active side of a device die; and
      electrically coupling a package component to the redistribution structure; and
   attaching the redistribution structure of the integrated fan-out structure to a substrate embedded in a first portion of a cover, the integrated fan-out structure being embedded in a second portion of the cover, the redistribution structure being electrically coupled to a power connector through a first contact pad and through a second contact pad.

2. The method of claim 1 further comprising, before forming the redistribution structure, embedding lateral sides of the device die in a molding material, wherein the molding material is level with contacts of the device die.

3. The method of claim 2, wherein after attaching the redistribution structure to the substrate, the molding material is in physical contact with the first portion of the cover.

4. The method of claim 1, wherein the first contact pad and the second contact pad are electrically coupled at a same edge of the redistribution structure.

5. The method of claim 4, wherein in a plan view an outline of the redistribution structure is within an outline of the substrate.

6. The method of claim 1, wherein the first contact pad is electrically coupled at a first edge of the redistribution structure, wherein the second contact pad is electrically coupled at a second edge of the redistribution structure, and wherein the first edge is opposite the second edge.

7. The method of claim 6, wherein in a plan view a majority of the redistribution structure extends beyond the substrate.

8. The method of claim 1 further comprising, before attaching the redistribution structure to the substrate, singulating the integrated fan-out structure from other integrated fan-out structures.

9. A method of forming a semiconductor device, the method comprising:
   embedding a printed circuit board in a lower portion of a cover, the printed circuit board being in physical contact with an upper surface and an inner sidewall of the lower portion of the cover; and
   installing a partial semiconductor package in the cover, the partial semiconductor package being electrically coupled to the printed circuit board, the partial semiconductor package comprising:
      a device die electrically coupled to a first side of a redistribution structure; and a package component electrically coupled to a second side of the redistribution structure, the second side being opposite the first side.

10. The method of claim 9, wherein the partial semiconductor package is embedded in an upper portion of the cover.

11. The method of claim 10, wherein the package component is encircled by the printed circuit board.

12. The method of claim 10, wherein a power connector is disposed between the upper portion of the cover and the printed circuit board, and wherein a first trace and a second trace electrically couple the power connector to the redistribution structure.

13. The method of claim 12, wherein a portion of the first trace is directly interposed between the printed circuit board and the upper portion of the cover.

14. The method of claim 9 further comprises:
attaching the device die to a carrier substrate;
embedding the device die in a molding material;
forming the redistribution structure adjacent the device die;
attaching the package component to the redistribution structure; and
removing the carrier substrate.

15. The method of claim 9, wherein an antenna is mounted on the printed circuit board and electrically coupled to the partial semiconductor package.

16. A method of forming a semiconductor device, the method comprising:
forming a partial semiconductor package, the forming the partial semiconductor package comprising:
embedding a first device die in a molding material;
forming a redistribution structure extending along a first side of the first device die and a first side of the molding material; and
attaching a package component to the redistribution structure;
attaching the partial semiconductor package to a printed circuit board to form an integrated circuit structure; and
embedding the integrated circuit structure in a cover, the printed circuit board being in physical contact with a lower portion of the cover, the molding material of the partial semiconductor package being in physical contact with an upper portion of the cover.

17. The method of claim 16, wherein the forming the partial semiconductor package further comprises embedding a second device die in the molding material, the redistribution structure being electrically coupled to contacts on the first device die and contacts on the second device die.

18. The method of claim 16, wherein the printed circuit board has a ring shape, and wherein a portion of the partial semiconductor package extends at least partially through the ring shape of the printed circuit board.

19. The method of claim 18, wherein the package component extends at least partially through the ring shape of the printed circuit board.

20. The method of claim 16, wherein a power connector is mounted within the cover and electrically coupled to the redistribution structure, and wherein an antenna is mounted to the printed circuit board and electrically coupled to the redistribution structure.

* * * * *